United States Patent

Aggarwal et al.

[11] Patent Number: 5,900,757
[45] Date of Patent: May 4, 1999

[54] CLOCK STOPPING SCHEMES FOR DATA BUFFER

[75] Inventors: Sandeep K. Aggarwal, Santa Cruz; Srinivas Nori, San Jose; Marc E. Levitt, Sunnyvale, all of Calif.

[73] Assignee: Sun Microsystems, Inc., Palo Alto, Calif.

[21] Appl. No.: 08/672,329

[22] Filed: May 1, 1996

[51] Int. Cl.⁶ .................................................. H03L 7/06
[52] U.S. Cl. .......................... 327/198; 327/156; 327/142
[58] Field of Search .................................. 327/198, 142, 327/144–147, 155–156, 299; 331/1 A, 17, 25

[56] References Cited

U.S. PATENT DOCUMENTS

| | | | |
|---|---|---|---|
| 5,347,232 | 9/1994 | Nishimichi | 331/1 A |
| 5,414,745 | 5/1995 | Lowe | 327/142 |
| 5,473,767 | 12/1995 | Kardach et al. | 395/550 |
| 5,481,731 | 1/1996 | Conary et al. | 395/750 |

*Primary Examiner*—Timothy P. Callahan
*Assistant Examiner*—Eunja Shin
*Attorney, Agent, or Firm*—Forrest Gunnison

[57] ABSTRACT

A circuit is disclosed which allows an IN-Test to be performed on an integrated circuit (IC) without having to stop the external clock sources by disabling the IC's internal phase-locked loops. Information indicative of the IC's clock mode and of the desired stop mode is contained within the IC's clock control register. In one embodiment, the internal clocks may be stopped in either of three stop modes while operating in one of three clock modes. When it is desired to stop the IC's internal clocks, the clock control register provides a stop instruction signal STOP_INSTR to a clock control circuit which, depending upon the particular stop mode and clock mode encoded in signal STOP_INSTR by the clock control register, asserts a enabling signal to a disable clock circuit. In response to this active-high enabling signal, the disable clock circuit asserts a zero feedback signal to the internal phase-locked loops of the IC and thereby forces the voltage controlled oscillators within the phase-locked loops to hold internal clocks low. In this manner, the IC internal clocks may be stopped to allow a test vector to be scanned out of the IC during an IN-Test without stopping the external clock source.

16 Claims, 5 Drawing Sheets

CLOCK STOPPING SCHEMES FOR DATA BUFFER

BACKGROUND

1. Field of the Invention

The present invention relates to a structure and method for stopping internal clocks of an integrated circuit to facilitate IN-testing of the integrated circuit.

2. Description of Related Art

The market for semiconductor devices is becoming increasingly competitive as more manufacturers are introducing a wider variety of semiconductor products. With many products from which to choose, consumers are able to make greater performance demands. Recognizing the significance that an integrated circuit's performance may play in the marketplace, manufacturers employ various tests to ensure that each of their respective integrated circuits (ICs) performs as intended.

One well known method of testing the performance of a particular IC is to subject the IC to what the semiconductor industry has termed an "IN-Test." To perform such a test, scannable elements within the logic of the IC are connected in a signal path to one another to form a scan chain. With the IC in a scan mode, a test vector is provided as an input signal to the IC. After allowing the IC to operate for a number of clock cycles, the internal clocks of the IC are stopped, thereby disabling the IC system logic so as to "freeze" the logic states within the scannable elements. The IC is then clocked with a separate scan clock so as to capture, or "scan" out, these logic states as an output vector. The output vector is read from an output port of the IC and compared to a reference vector to determine if the IC has operated correctly.

In performing such an IN-Test, the internal clocks are typically stopped by stopping the external oscillator that generates the internal clocks. Stopping the external oscillator in such a manner is not only inconvenient but also may result in harmful jitters.

Thus, it would be desirable to perform an IN-Test without stopping the external oscillator that provides the internal clocks to the IC.

SUMMARY

A circuit is disclosed which allows an IN-Test to be performed on an IC without having to stop the IC's associated external oscillator. In accordance with the present invention, an IC's internal clocks are stopped by disabling the IC's internal phase-locked loops (PLL). In one embodiment, where for instance the IC employs an internal system clock SYS_CLK and an internal bus clock EBUS_CLK, the internal clocks may be stopped on either the rising edge of EBUS_CLK, on the rising edge of SYS_CLK, or on the synchronous rising edges of EBUS_CLK and SYS_CLK. These three options are hereinafter referred to as stop mode. Further, such internal clocks may be stopped for any number of different frequency relationships between the internal clocks, e.g., where for instance the frequency ratio of clocks EBUS_CLK and SYS_CLK is 1:1, 1:2, 3:2, and so on. The particular ratio of frequencies of bus clock EBUS_CLK and system clock SYS_CLK is hereinafter referred to as the clock mode. Information indicative of the IC's clock mode and of the desired stop mode is programmed in the IC's clock control register (CCR) as a stop instruction signal STOP_INSTR which, in some embodiments, may be a multi-bit signal. When it is desired to stop the IC's internal clocks, the clock control register provides the signal STOP_INSTR to a clock control circuit (CCC) which, depending upon the particular stop mode and clock mode indicated by signal STOP_INSTR, asserts an enabling signal to a disable clock circuit (DCC). In response to this enabling signal, the disable clock circuit asserts a zero feedback signal to the internal phase-locked loop circuits of the IC and thereby forces the voltage controlled oscillators (VCO) within the phase-locked loop circuits to hold internal clocks SYS_CLK and EBUS_CLK at one particular logic state e.g. low. In this manner, the IC's internal clocks SYS_CLK and EBUS_CLK may be stopped to allow a test vector to be scanned out of the IC during an IN-Test without stopping the IC's external oscillator.

DETAILED DESCRIPTION

Figure 1A:
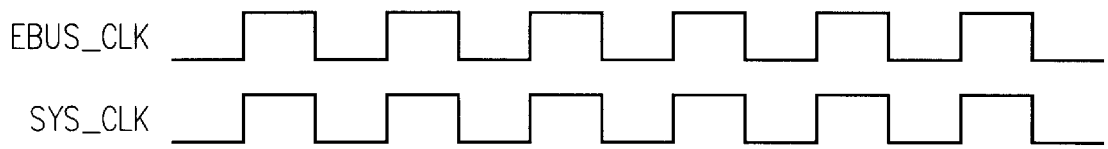
FIGS. 1A–1C are timing diagrams illustrating internal clocks EBUS_CLK and SYS_CLK in 1:1, 1:2, and 2:3 modes, respectively.
Figure 1B:
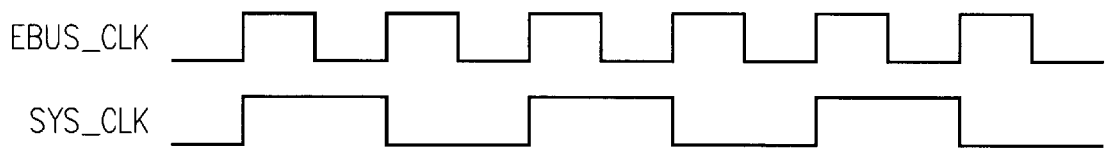
Figure 1C:
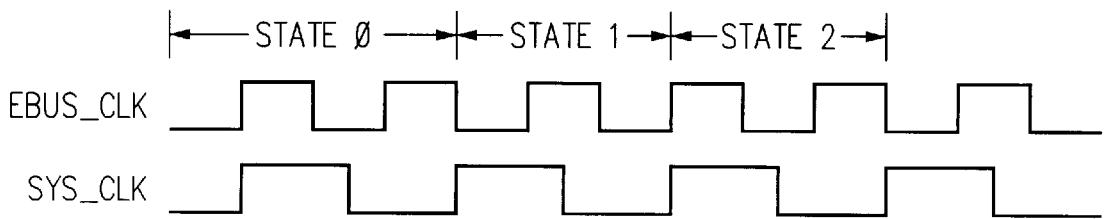

In accordance with the present invention, an IC's internal clocks may be disabled in response to a stop signal without stopping, decoupling, or otherwise tampering with the external oscillator from which the internal clocks are generated. Embodiments of the present invention may be implemented with ICs employing either one internal clock or a plurality of internal clocks having various frequency relationships with respect to one another, and to ICs having either a single scan chain clocked by one internal clock or multiple scan chains clocked by one or more different internal clocks. For simplicity, embodiments of the present invention are discussed below in the context of an IC utilizing two internal clocks, a system clock SYS_CLK and a bus clock EBUS_CLK, where the ratio of frequencies of bus clock EBUS_CLK and system clock SYS_CLK may be either 1:1, 1:2, or 2:3. Waveforms illustrating the relationship between system clock SYS_CLK and bus clock EBUS_CLK for each of the 1:1, 1:2 and 2:3 ratios are depicted in FIGS. 1A, 1B, and 1C, respectively. It is to be noted that those skilled in the art will, after reading Applicant's specification, be able to adapt embodiments described below for use with ICs employing a greater number of internal clocks and/or a greater range of frequency ratios between such internal clocks.

Further note that ICs which are described herein for illustrative purposes may have one or more scan chains clocked by system clock SYS_CLK and/or one or more scan chains clocked by bus clock EBUS_CLK. Thus, for the example IC just described, there are 9 possible combinations of clock and stop modes, i.e., 3 clock modes times 3 stop modes. Note, however, that since the bus clock EBUS_CLK need not be monitored when stopping the internal clocks on the rising edge of system clock SYS_CLK, and vice versa, these 9 possible combinations may be reduced to 5 different scenarios which are briefly described below.

1. SYS_CLK stop

In this scenario, both internal clocks SYS_CLK and EBUS_CLK may be stopped on the first rising edge of clock SYS_CLK detected after a stop signal has been asserted. Here, since only the rising edge of clock SYS__CLK need be detected in order to stop both internal clocks, the rising edge of bus clock EBUS__CLK, and thus the frequency ratio of clocks SYS__CLK and EBUS__CLK, is not relevant.

2. EBUS__CLK stop

In this scenario, both internal clocks SYS__CLK and EBUS__CLK may be stopped on the first rising edge of clock EBUS__CLK detected after a stop signal has been asserted. Here, since only the rising edge of clock EBUS__CLK need be detected in order to stop both internal clocks, the rising edge of system clock SYS__CLK, and thus the frequency ratio of clocks SYS__CLK and EBUS__CLK, is not relevant.

3. Synchronous 1:1 stop

In this scenario, internal clocks EBUS__CLK and SYS__CLK are of the same frequency (hence the 1:1 ratio) and are both stopped upon detection of the first synchronous rising edges thereof after a stop signal has been asserted.

4. Synchronous 1:2 stop

In this scenario, the frequency of clock EBUS__CLK is twice that of system clock SYS__CLK. Clocks EBUS__CLK and SYS__CLK are stopped upon detection of the first synchronous rising edges thereof after a stop signal has been asserted.

5. Synchronous 2:3 stop

Figure 2:
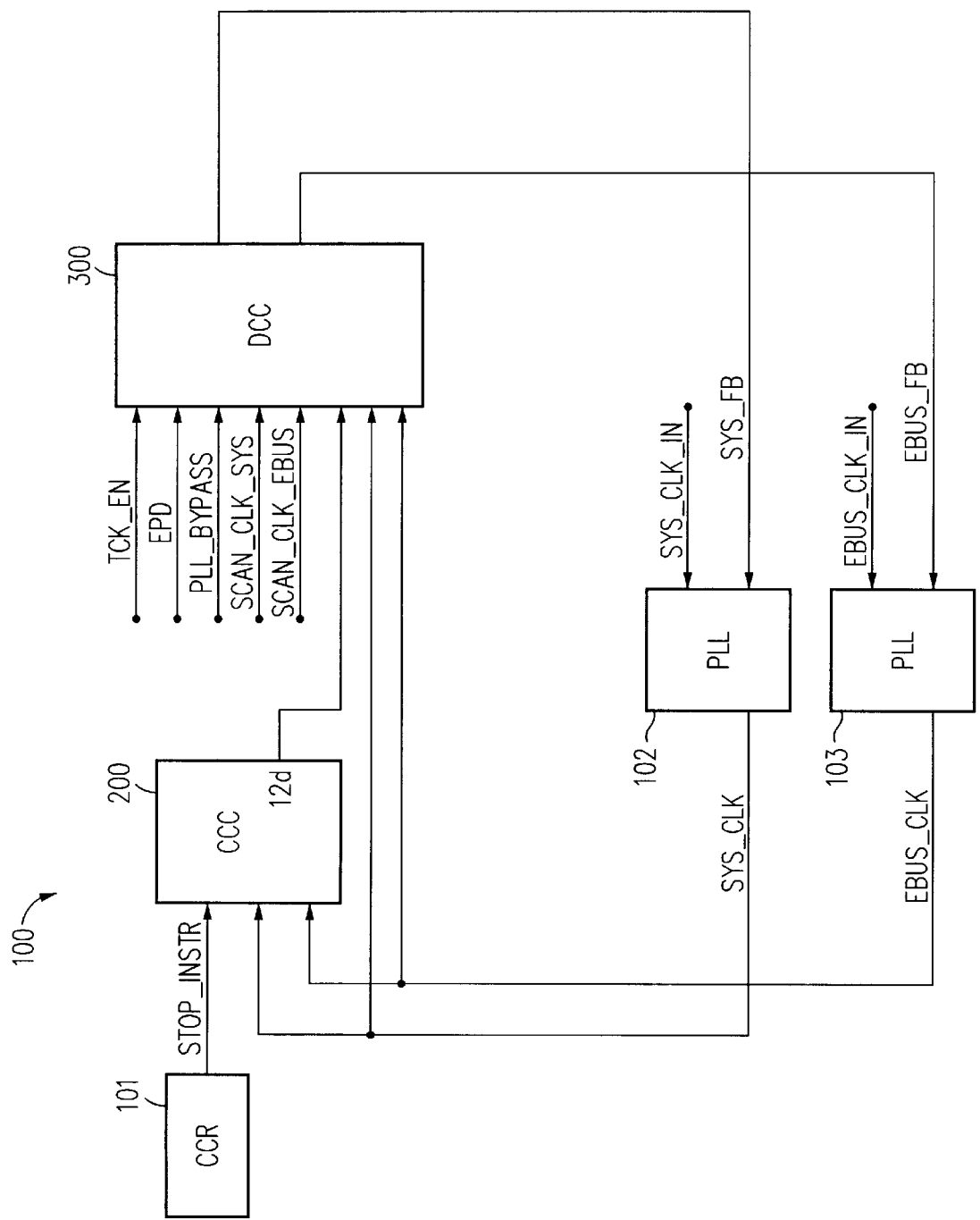
FIG. 2 is a block diagram of a clock stopping circuit in accordance with the present invention.

In this scenario, the frequency of bus clock EBUS__CLK is 1.5 times that of system clock SYS__CLK. Both clocks are stopped upon detection of the first synchronous rising edges thereof after a stop signal has been asserted. In the discussion that follows, reference is made to FIGS. 2–4, where corresponding elements of the Figures are given identical reference numerals. Referring to FIG. 2, circuit 100 is formed within an associated IC (not shown) having a conventional clock control register (CCR) 101 and conventional phase-locked loop (PLL) circuits 102 and 103. Respective raw system and bus clock signals SYS__CLK__IN and EBUS__CLK__IN are generated by an external oscillator (not shown) and provided to respective phase-locked loop circuits 102 and 103 which, in turn, generate respective internal system and bus clock signals SYS__CLK and EBUS__CLK in a well known manner. Note that embodiments of the present invention described below may be used with integrated circuits which generate internal clock signals SYS__CLK and EBUS__CLK using means other than phase-locked loop circuits.

Information indicative of the clock mode e.g. frequency ratio of system clock SYS__CLK and bus clock EBUS__CLK and of the desired stop mode to be used in stopping these internal clocks, so as to facilitate an IN-Test, is programmed into clock control register (CCR) 101. When it is desired to stop system clock SYS__CLK and bus clock EBUS__CLK, clock control register 101 provides an instruction signal STOP__INSTR to clock control circuit (CCC) 200 which, in response thereto, provides an enabling signal to disable clock circuit (DCC) 300. Note that in some embodiments instruction signal STOP__INSTR may be a multi-bit signal. Once enabled, disable clock circuit 300 provides inactive feedback signals SYS__FB and EBUS__FB to phase-locked loop circuits 102 and 103, respectively. In this manner, phase-locked loop circuits 102 and 103 hold system clock SYS__CLK and bus clock EBUS__CLK at a constant logic level e.g. low, respectively, thereby internally stopping system clock SYS__CLK and bus clock EBUS__CLK without affecting the operation of the external oscillator used to generate system clock SYS__CLK and bus clock EBUS__CLK.

Figure 3A:
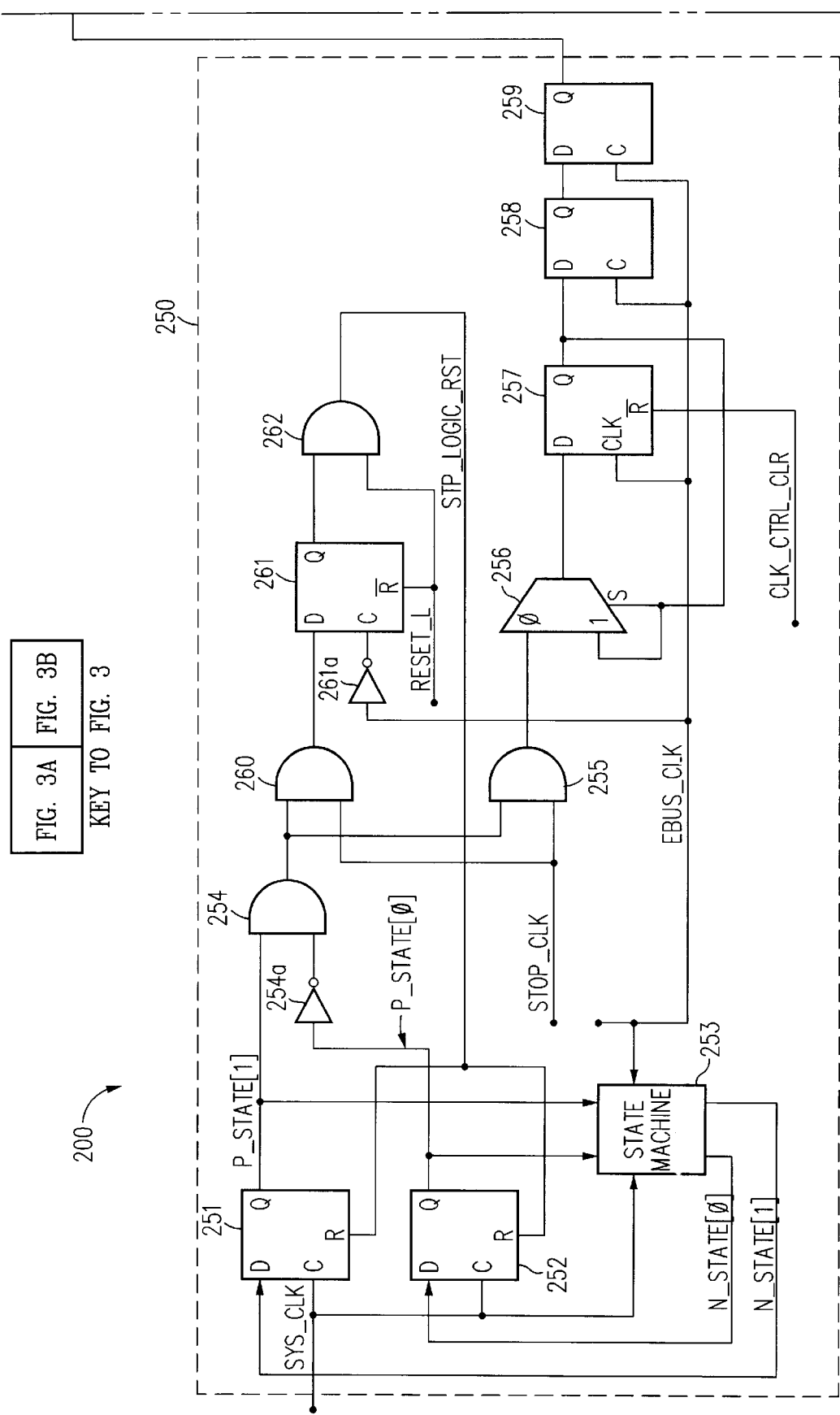
FIG. 3 is, which is a key to FIGS. 3A and 3B, a schematic diagram of a clock control circuit in accordance with the circuit of FIG. 1.
Figure 3B:
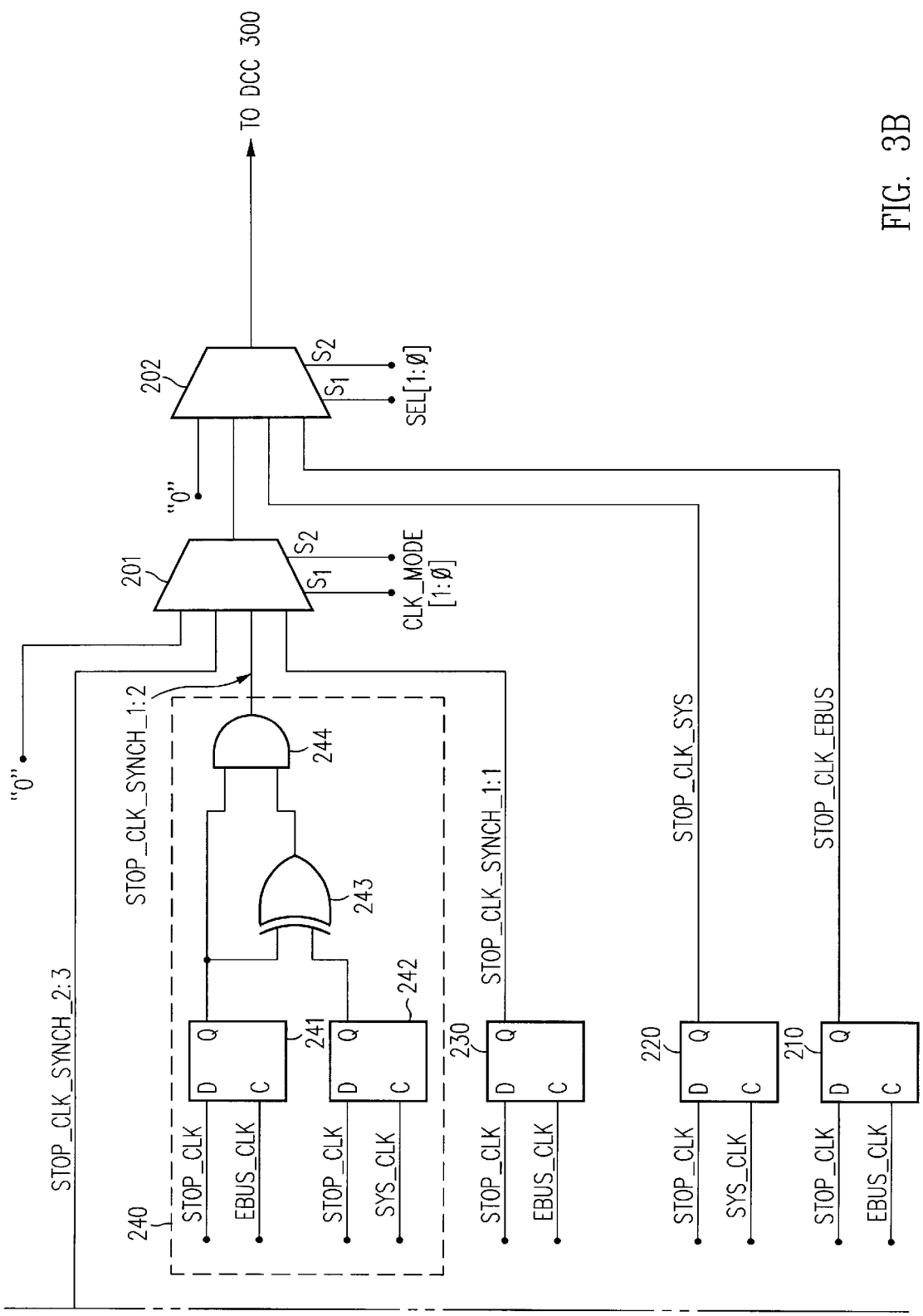
Figure 4:
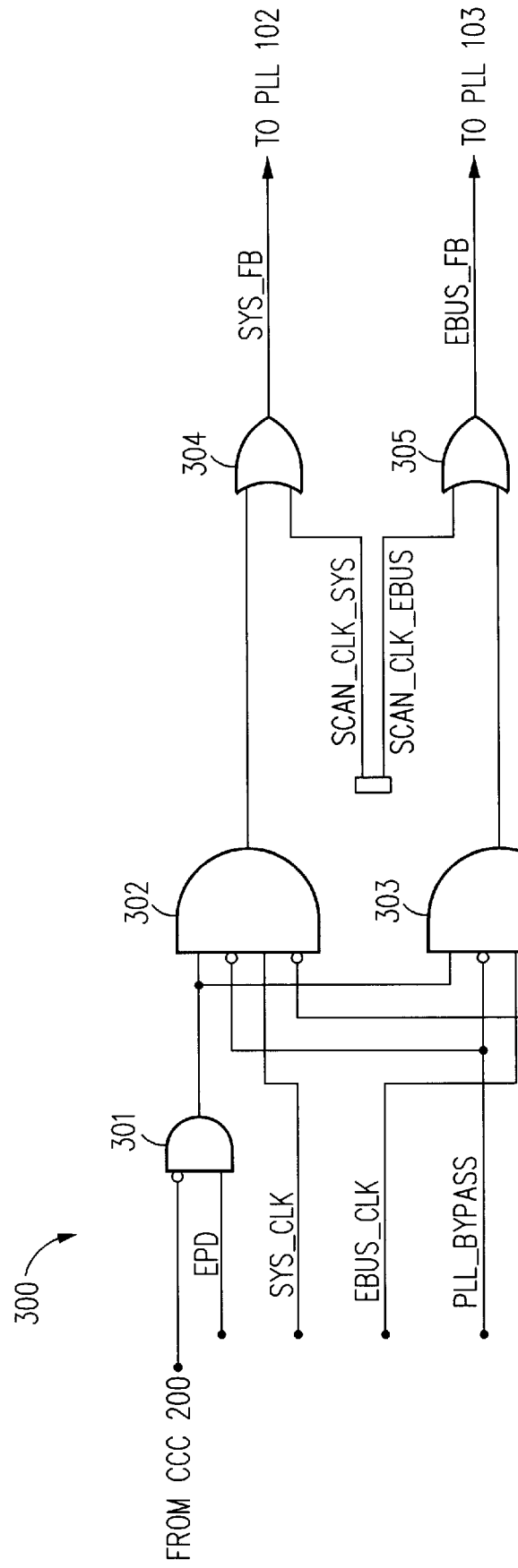
FIG. 4 is a schematic diagram of a disable clock circuit in accordance with the circuit of FIG. 1.

Referring also to FIG. 3, clock control circuit 200 includes five subcircuits 210, 220, 230, 240, and 250 which are responsible for providing an enabling signal to disable clock circuit 300 in accordance with the five above-mentioned stopping scenarios SYS__BUS stop, EBUS__CLK stop, Synchronous 1:1, Synchronous 1:2, and Synchronous 2:3, respectively. In one embodiment, subcircuits 230, 240, and 250 provide in response to a signal STOP__CLK extracted from instruction signal STOP__INSTR, enabling signals STOP__CLK__SYNCH__1:1, STOP__CLK__SYNCH__1:2, and STOP__CLK__SYNCH__2:3, respectively, to associated input terminals of a 4:1 multiplexer 201. The output terminal of multiplexer 201 is coupled to a 4:1 multiplexer 202.

Subcircuits 210 and 220 generate, in response to signal STOP__CLK, respective enabling signals STOP__CLK__EBUS and STOP__CLK__SYS which are provided to associated input terminals of multiplexer 202. Note that logic low signals may also be provided to respective input terminals of multiplexers 201 and 202, as shown in FIG. 3, to force the signals generated at the output terminals thereof to logic zero. Bits [1:0] and [3:2] of instruction signal STOP__INSTR are provided to the select terminals of multiplexers 201 and 202, respectively, and thus in accordance with the information programmed in clock control register 101 determine which of the output signals generated by subcircuits 210, 220, 230, 240, and 250 is sent as an enabling signal to disable clock circuit 300. In other embodiments, instruction signal STOP__INSTR stored in clock control register 101 may contain five enabling signals each independently activating subcircuits 210, 220, 230, 240, and 250. In such embodiments, multiplexers 201 and 202 are not necessary.

Subcircuits 210, 220, and 230 are, in one embodiment, conventional D-type flip-flops. Flip-flop 210 clocks signal STOP__CLK on the rising edge of bus clock EBUS__CLK to generate signal STOP__CLK__EBUS. Thus, when signal STOP__CLK is driven high, signal STOP__CLK__EBUS transitions high on the next rising edge of bus clock EBUS__CLK and thereby provides a logic high enabling signal to disable clock circuit 300 via multiplexers 201 and 202. In a similar manner, flip-flop 220 clocks system clock STOP__CLK on the rising edge of system clock SYS__CLK to generate signal STOP__CLK__SYS and thereby enables disable clock circuit 300 upon detection of the first rising edge of system clock SYS__CLK after signal STOP__CLK transitions high.

When stopping system clock SYS__CLK and bus clock EBUS__CLK on the synchronous rising edges thereof, the enabling of disable clock circuit 300 is conditioned upon the alignment of rising edges of system clock SYS__CLK and bus clock EBUS__CLK (and of course upon signal STOP__CLK being asserted high by clock control register 101). Note, however, that where the clock frequency ratio is 1:1, bus clock EBUS__CLK and system clock SYS__CLK are replicas of one another and are thus necessarily aligned with respect to each other. As a result, when operating in the synchronous 1:1 scenario, it is necessary to detect the rising edge of only one of the clocks. Accordingly, signal STOP__CLK__SYNCH__1:1 may be generated by D flip-flop 230 in a manner similar to that discussed above with respect to flip-flops 210 and 220. Note that although shown in FIG. 3 as clocking STOP__CLK on the rising edge of bus clock EBUS__CLK, flip-flop 230 may in other embodiments generate signal STOP__CLK__SYNCH__1:1 by clocking signal STOP__CLK on the rising edge of system clock SYS__CLK.

Subcircuit 240 includes D-type flip-flops 241 and 242 which clock signal STOP__CLK on the rising edges of bus clock EBUS_CLK and system clock SYS_CLK, respectively. The signals generated at the Q output terminals of flip-flops 241 and 242 are gated in an XOR gate 243 and an AND gate 244, as shown in FIG. 3, to generate signal STOP_CLK_SYNCH_1:2. In this manner, subcircuit 240 causes signal STOP_CLK_SYNCH_1:2 to transition high, thereby providing a high enabling signal to disable clock circuit 300 via multiplexers 201 and 202, upon detection of the first synchronous rising edges of bus clock EBUS_CLK and system clock SYS_CLK after signal STOP_CLK has been asserted high.

Subcircuit 250 includes resettable D-type flip-flops 251 and 252 and a state machine 253. Bus clock EBUS_CLK and system clock SYS_CLK are provided as input signals to state machine 253. The logic states of the bit signals P_STATE[1] and P_STATE[0] generated at the respective Q output terminals of flip-flops 251 and 252 and provided to state machine 253 indicate in binary format the present state of subcircuit 250. For example, the bit pair P_STATE[1]= "1" and P_STATE[0]="0" denotes the binary number "10" and is therefore indicative of state 2. State machine 253, in response to the state of bits P_STATE[1] and P_STATE[0], system clock SYS_CLK and bus clock EBUS_CLK, determines the next state of subcircuit 250, as indicated in binary form by the state of bits N_STATE[1] and N_STATE[0]. Bits N_STATE[1] and N_STATE[0] are provided to the D input terminals of flip-flops 251 and 252, respectively, and are clocked on the rising edge of system clock SYS_CLK by flip-flops 251 and 252, respectively. Bit P_STATE[1] is also provided to a first input terminal of an AND gate 254, and bit P_STATE[0] is provided to a second input terminal of AND gate 254 via an inverter 254a.

State machine 253, which may be of conventional design, allows for three possible states, state 0, state 1, and state 2, which correspond to the three intervals indicated in the timing diagram of FIG. 1C. The first state i.e. state 0, where the state of bits P_STATE[1:0] equals "00", is the default state. Note that in state 0 the low state of bit P_STATE[1] forces a low signal at the output terminal of AND gate 254 which, in turn, propagates through AND gate 255. The normally low signal at the Q output terminal of flip-flop 257 is provided as the select signal of multiplexer 256. Hence, this low state of bit P_STATE[1] passes through 2:1 multiplexer 256 and flip-flops 257–259, thereby forcing signal STOP_CLK_SYNCH_{2:3 low}.

If, while in state 0, state machine 253 detects that bus clock EBUS_CLK is high and system clock SYS_CLK is low, state machine 253 advances subcircuit 250 to state 1 by driving bit N_STATE[1] low and bit N_STATE[0] high. Subcircuit 250 will remain in state 1 until system clock SYS_CLK and bus clock EBUS_CLK are simultaneously low. Also note that in state 1, the low state of bit P_STATE[1] forces signal STOP_CLK_SYNCH_{2:3 low}.

If, while in state 1, state machine 253 detects that bus clock EBUS_CLK and system clock SYS_CLK are both low, state machine 253 drives bit N_STATE[1] high and bit N_STATE[0] low, thereby advancing subcircuit 250 to state 2. With bit P_STATE[1] high and bit P_STATE[0] low, a logic high signal appears at the output terminal of AND gate 254 and is provided to input terminals of AND gates 255 and 260. If clock control register 101 has not instructed circuit 100 to stop system clock SYS_CLK and bus clock EBUS_CLK, signal STOP_CLK remains low and therefore forces a low signal at the output terminal of AND gate 255 which, in turn, forces signal STOP_CLK_SYNCH_{2:3 low. Note that the low state of signal STOP_CLK also propagates through AND gate 260, resettable D-type flip-flop 261, and AND gate 262} to force signal STP_LOGIC_RST low, thereby allowing state machine 253 to operate in a normal manner in determining the next state of subcircuit 250. The next state of subcircuit 250 depends upon the bus clock EBUS_CLK and system clock SYS_CLK. A truth table describing the operation of state machine 253 in generating the next state (N_STATE[1:0]) from the present state (P_STATE[1:0]) and from bus clock EBUS_CLK and system clock SYS_CLK is shown below in Table 1.

TABLE 1

TRUTH TABLE FOR STATE MACHINE 253

| PRESENT STATE | Bus clock EBUS_CLK | System clock SYS_CLK | NEXT STATE |
| --- | --- | --- | --- |
| 0 | 0 | 0 | 2 |
| 0 | 0 | 1 | 0 |
| 0 | 1 | 0 | 1 |
| 0 | 1 | 1 | 0 |
| 1 | 0 | 0 | 2 |
| 1 | 0 | 1 | 1 |
| 1 | 1 | 0 | 1 |
| 1 | 1 | 1 | 1 |
| 2 | 0 | 0 | 0 |
| 2 | 0 | 1 | 2 |
| 2 | 1 | 0 | 1 |
| 2 | 1 | 1 | 2 |

On the other hand, if clock control register 101 drives signal STOP_CLK high while subcircuit 250 is in state 2, high signals appear at the output terminals of AND gates 255 and 260. The high signal at the output terminal of AND gate 255 propagates through multiplexer 256 and is clocked on the rising edge of bus clock EBUS_CLK by flip-flop 257 which, in one embodiment, is a resettable D-type flip-flop. The resulting high signal at the Q output terminal of flip-flop 257 is successively clocked on the rising edges of bus clock EBUS_CLK by D-type flip-flops 258 and 259 which form a greatest common denominator circuit. Accordingly, flip-flop 259 drives signal STOP_CLK_SYNCH_2:3 high and thereby provides a logic high enabling signal to disable clock circuit 300.

Note that the high signal at the Q output terminal of flip-flop 257 forces multiplexer 256 to select itself, i.e., the logic one state of the signal at the Q output terminal of flip-flop 257, and thereby ensures that signal STOP_CLK_SYNCH_2:3 remains high for a sufficient period of time to enable disable clock circuit 300. Also note that signal STOP_CLK_SYNCH_2:3 may be forced low by setting signal CLK_CTRL_CLR low which, in turn, resets the signal at the Q output terminal of flip-flop 257 low.

The high signal appearing at the output terminal of AND gate 260 is clocked on the rising edge of $\overline{EBUSCLK}$ by flip-flop 261. Assuming an active low reset signal RESET_L has not been enabled, AND gate 262 drives a signal STP_LOGIC_RST high. The high state of signal STP_LOGIC_RST is provided to the active high reset terminals of flip-flops 251 and 252, thereby resetting subcircuit 250 to state 0. Once reset, subcircuit 250 continues to operate in the manner described above.

Disable clock circuit 300 includes an AND gate 301 having a first input terminal coupled to receive an inverted replica of the enabling signal generated as discussed above by clock control circuit 200. AND gate 301 has a second input terminal coupled to receive an active low external power down signal EPD. In this manner, the enabling signal received from clock control circuit 200 is inverted and then gated with the high state of signal EPD to generate an active low stop signal at an output terminal of AND gate 301.

4-input AND gates 302 and 303 each have a first input terminal coupled to receive this active low stop signal provided at the output terminal of AND gate 301. Second and third input terminals of each of AND gates 302 and 303 are coupled to receive active low signals PLL_BYPASS and TCK_EN (TCK enable) signals, respectively, which are generated in a well known manner by sources external to circuit 100. The fourth input terminal of AND gate 302 is coupled to receive system clock SYS_CLK from the VCO terminal of phase-locked loop circuit 102, and the fourth input terminal of AND gate 303 is coupled to receive bus clock EBUS_CLK from the VCO terminal of phase-locked loop circuit 103.

The signal output from AND gate 302 is gated with an active low signal SCAN_CLK_SYS via an OR gate 304, while the signal output from AND gate 303 is gated with an active low signal SCAN_CLK_EBUS via an OR gate 305. Signals SCAN_CLK_EBUS and SCAN_CLK_SYS, which may be used to independently disable bus clock EBUS_CLK and system clock SYS_CLK, respectively, are generated by sources external to circuit 100. The output terminal of OR gate 304 is coupled to a feedback terminal of phase-locked loop circuit 102 to provide feedback signal SYS_FB to phase-locked loop circuit 102. The output terminal of OR gate 305 is coupled to a feedback terminal of phase-locked loop circuit 103 to provide feedback signal EBUS_FB to phase-locked loop circuit 103.

Disable clock circuit 300 operates as follows. Assume that control signals EPD, TCK_EN, PLL_BYPASS, SCAN_CLK_SYS, and SCAN_CLK_EBUS are held high and are thus inactive. During normal operation of circuit 100's associated IC, i.e., when it is not desired to stop system clock SYS_CLK and bus clock EBUS_CLK, clock control circuit 200 provides a logic low enabling signal to disable clock circuit 300. This logic low signal is inverted and gated with the normally high state of signal EPD to provide a high signal to the first input terminal of AND gate 302. Since control signals PLL_BYPASS, TCK_EN, and SCAN_CLK_SYS are also high and thus not asserted, system clock SYS_CLK propagates unaltered through disable clock circuit 300 and is provided as feedback signal SYS_FB to phase-locked loop circuit 102. Similarly, bus clock EBUS_CLK propagates through disable clock circuit 300 and is provided as feedback signal EBUS_FB to phase-locked loop circuit 103. In this manner, disable clock circuit 300 allows phase-locked loop circuits 102 and 103 to operate in a normal manner when it is not desired to stop the internal clocks e.g. system clock SYS_CLK and bus clock EBUS_CLK.

When it is desired to stop the internal clocks, clock control circuit 200, as described above, asserts a high enabling signal in response to a stop instruction signal STOP_INSTR received from clock control register 101. This logic high enabling signal is inverted and gated with the high state of signal EPD via AND gate 301 to produce a logic low signal at the output terminal thereof. This logic low signal appears at the first input terminal of AND gate 302, thereby forcing the signal provided at the output terminal of AND gate 302 low which, in turn, forces the signal provided at the output terminal of OR gate 304 e.g. signal SYS_FB low. In response to this low state of signal SYS_FB, the VCO output terminal of phase-locked loop circuit 102, and thus system clock SYS_CLK, transitions low. In a similar manner, the low enabling signal propagates through AND gate 303 and OR gate 305 to force feedback signal EBUS_FB low which, in turn, results in phase-locked loop circuit 103 holding bus clock EBUS_CLK low.

Note that phase-locked loop circuits 102 and 103 will continue to hold respective internal clock signals SYS_CLK and EBUS_CLK low until clock control circuit 200 re-asserts a low enabling signal to disable clock circuit 300. Accordingly, circuit 100 is able to disable and thereby effectively stop an associated IC's internal clock signals e.g. system clock SYS_CLK and bus clock EBUS_CLK without altering or tampering with the external oscillator from which such internal clock signals are generated.

Note that system clock SYS_CLK and bus clock EBUS_CLK may be simultaneously disabled as described above with respect to disable clock circuit 300 by forcing any of control signals EPD, PLL_BYPASS, or TCK_EN low. In addition, system clock SYS_CLK and bus clock EBUS_CLK may be independently disabled as described above with respect to disable clock circuit 300 by asserting respective control signals SCAN_CLK_SYS and SCAN_CLK_EBUS low.

While particular embodiments of the present invention have been shown and described, it will be obvious to those skilled in the art that various changes and modifications may be made without departing from this invention in its broader aspects and, therefore, the appended claims encompass all such changes and modifications as fall within the true spirit and scope of this invention.

What is claimed is:

1. A structure for disabling an internal clock of an integrated circuit without disabling an external clock thereof, said integrated circuit including a clock circuit which generates said internal clock in response to said external clock and a feedback signal provided to a feedback terminal thereof, said structure comprising:

a clock stop signal line;

a clock control circuit having an input terminal connected to said clock stop signal line, and having an output terminal; and a disable clock circuit having a first input terminal coupled to said output terminal of said clock control circuit; a second input terminal coupled to said internal clock; and an output terminal coupled to said feedback terminal of said clock circuit, wherein said clock stop signal line, said clock control circuit, and said disable clock circuit are internal to said integrated circuit and further wherein upon a control signal on said clock stop signal line having a predefined state, said disable clock circuit generates a feedback signal on said output terminal coupled to said feedback terminal that causes said clock circuit to generate a constant level internal clock.

2. The structure of claim 1, wherein said clock circuit comprises a phase-locked loop circuit including a voltage-controlled oscillator.

3. The structure of claim 2, wherein said disable clock circuit comprises a logic circuit, wherein said logic circuit, in response to a disable signal on said first input terminal of said disable clock circuit, selectably provides either said internal clock or said feedback signal to said feedback terminal of said phase-locked loop circuit.

4. The structure of claim 1, wherein said clock control circuit further comprises:

a first subcircuit having first and second input terminals coupled to receive said internal clock, and said control signal on said clock stop signal line, respectively, said first subcircuit using said internal clock to clock said control signal and, in response thereto, providing a first output signal at an output terminal thereof.

5. The structure of claim 4, wherein said integrated circuit includes a second clock circuit for generating a second internal clock in response to a second external clock provided thereto and to said feedback signal, said clock control circuit further comprising:

a second subcircuit having first and second input terminals coupled to receive said second internal clock and said control signal, respectively, said second subcircuit using said second internal clock to clock said control signal and, in response thereto, providing a second output signal at an output terminal thereof.

6. The structure of claim 5, wherein said first and second subcircuits each comprise D-type flip-flops.

7. The structure of claim 5, wherein said clock control circuit further includes a third subcircuit comprising:

a first flip-flop having an input terminal coupled to receive said first-mentioned internal clock, said first flip-flop using said first internal clock to clock said control signal and, in response thereto, providing a first stop signal at an output terminal thereof;

a second flip-flop having an input terminal coupled to receive said second internal clock, said second flip-flop using said second internal clock to clock said control signal and, in response thereto, providing a second stop signal at an output terminal thereof; and logic coupled to said respective output terminals of said first and second flip-flops, said logic generating a disable signal in response to said first and second stop signals.

8. The structure of claim 7, wherein said logic comprises:

an XOR gate having first and second input terminals coupled to said respective output terminals of said first and second flip-flops; and an AND gate having first input terminal coupled to said output terminal of said first flip-flop and a second input terminal coupled to an output terminal of said XOR gate.

9. The structure of claim 7, wherein said first and second internal clocks are of differing phases.

10. The structure of claim 7, wherein said clock control circuit further includes a fourth subcircuit comprising:

a state machine having first and second input terminals for receiving first signals indicative of a present state and generating in response thereto second signals indicative of a next state at output terminal thereof;

a third flip-flop having an input terminal coupled to one of said output terminals of said state machine and having an output terminal coupled to one of said input terminals of said state machine;

a fourth flip-flop having an input terminal coupled to another of said output terminals of said state machine and having an output terminal coupled to another of said input terminals of said state machine; and logic for generating an output signal in response to said signals indicative of said present state.

11. A method for disabling an internal clock signal of an integrated circuit without disabling an external clock signal thereof, said method comprising:

generating said internal clock signal in response to said external clock signal and a feedback signal using a clock circuit;

receiving a control signal and said internal clock signal by a logic circuit;

generating said feedback signal by said logic circuit wherein when said control signal is indicative of normal operation, said internal clock signal is passed through said logic circuit as said feedback signal; and forcing, in response to said control signal being indicative of a desire to disable said internal clock signal, said feedback signal to an inactive state by said logic circuit so as to cause said internal clock signal to remain in its present logic state thereby disabling said internal clock signal.

12. A method for disabling an internal clock signal of an integrated circuit without disabling the external clock signal from which said internal clock signal is generated, said method comprising:

generating said internal clock signal by a phase-locked loop circuit in response to said external clock signal;

passing said internal clock signal through a logic circuit to said phase-locked loop circuit so that said internal clock signal is a feedback signal to said phase-locked loop circuit; and applying a control signal indicating a disabling of said internal clock signal to said logic circuit wherein in response to said control signal said logic circuit generates a signal as said feedback signal to said phase-locked loop circuit so as to cause said internal clock signal to transition to a logic low state thereby disabling said internal clock signal.

13. The method of claim 12 further comprising clocking said control signal on the rising edge of said internal clock signal to generate said feedback signal.

14. The method of claim 12 further comprising the steps of:

generating a second internal clock signal at an output terminal of a second phase-locked loop circuit in response to a second external clock signal;

passing said second internal clock signal as a feedback signal to said second phase-locked loop circuit; and generating, in response to a control signal indicating a disabling of said second internal clock signal, a signal as said feedback signal of said second phase-locked loop circuit so as to cause said second internal clock signal to transition to a logic low state.

15. The method of claim 14, wherein generating a signal as said feedback terminal signal further comprises:

clocking said control signal on the rising edge of said first-mentioned internal clock signal to generate a first stop signal;

clocking said control signal on the rising edge of said second internal clock signal to generate a second stop signal; and generating said feedback signals to said feedback terminals in response to said first and second stop signals.

16. A structure for disabling an internal clock of an integrated circuit without disabling an external clock thereof, said integrated circuit including a phase-locked loop clock circuit which generates said internal clock in response to said external clock and a signal provided to a feedback terminal thereof, said structure comprising:

a stop clock signal line;

a clock control circuit having a first input terminal connected to said stop clock signal line, a second input terminal connected to said internal clock, said clock control circuit generating a disable signal at an output terminal thereof in response to a control signal provided on said stop clock signal line and said internal clock; and a disable clock circuit having an input terminal connected to said output terminal of said clock control circuit and having an output terminal connected to said feedback terminal of said phase-locked loop clock circuit, wherein said disable clock circuit provides, in response to said disable signal, an inactive feedback signal at said feedback terminal of said phase-locked loop clock circuit and thereby disables said internal clock by forcing said internal clock to remain in a constant logic state.

\* \* \* \* \*

UNITED STATES PATENT AND TRADEMARK OFFICE
CERTIFICATE OF CORRECTION

PATENT NO.   : 5,900,757  
DATED        : May 4, 1999  
INVENTOR(S)  : Sandeep K. Aggarwal, Srinivas Nori, Marc E. Levitt Page 1 of 1

It is certified that error appears in the above-identified patent and that said Letters Patent is hereby corrected as shown below:

<u>Column 10, claim 15,</u>  
Line 48, delete "terminal".

Signed and Sealed this

Twenty-ninth Day of January, 2002

*Attest:*

JAMES E. ROGAN  
*Attesting Officer*     *Director of the United States Patent and Trademark Office*